(12) United States Patent
Park et al.

(10) Patent No.: US 9,647,613 B2
(45) Date of Patent: May 9, 2017

(54) DIFFERENTIAL AMPLIFIER

(71) Applicant: SK hynix Inc., Gyeonggi-do (KR)

(72) Inventors: Jae-Boum Park, Gyeonggi-do (KR); Cheol-Hoe Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 14/819,081

(22) Filed: Aug. 5, 2015

(65) Prior Publication Data

US 2015/0340998 A1  Nov. 26, 2015

Related U.S. Application Data

(62) Division of application No. 13/844,917, filed on Mar. 16, 2013, now Pat. No. 9,116,535.

(30) Foreign Application Priority Data

Dec. 18, 2012 (KR) .................. 10-2012-0148544

(51) Int. Cl.
| | |
|---|---|
| *H03F 1/30* | (2006.01) |
| *G05F 1/46* | (2006.01) |
| *H03F 3/45* | (2006.01) |
| *G05F 3/08* | (2006.01) |
| *H03F 1/02* | (2006.01) |
| *H03F 3/21* | (2006.01) |

(52) U.S. Cl.
CPC ............ *H03F 1/301* (2013.01); *G05F 1/463* (2013.01); *G05F 3/08* (2013.01); *H03F 1/0261* (2013.01); *H03F 3/211* (2013.01); *H03F 3/45179* (2013.01); *H03F 3/45183* (2013.01); *G05F 1/468* (2013.01); *H03F 2200/468* (2013.01); *H03F 2203/45674* (2013.01)

(58) Field of Classification Search
CPC .................................. H03F 1/301; G05F 1/463
USPC ............................................................ 330/256
See application file for complete search history.

(56) References Cited

U.S. PATENT DOCUMENTS

| | | | | |
|---|---|---|---|---|
| 4,475,103 A * | 10/1984 | Brokaw et al. | ......... | G08B 23/00 340/501 |
| 5,856,756 A * | 1/1999 | Sasahara | .................. | G05F 1/465 327/205 |
| 6,583,667 B1* | 6/2003 | Dasgupta et al. | ......... | H03F 3/45 330/254 |
| 6,729,755 B1* | 5/2004 | Yin | ........................... | G04G 3/02 331/176 |
| 2003/0011351 A1* | 1/2003 | Shim | ....................... | G05F 3/245 323/316 |
| 2005/0264347 A1* | 12/2005 | Gyohten | ................. | G05F 1/465 327/540 |
| 2009/0189694 A1* | 7/2009 | Davierwalla et al. | .... | H03F 3/45 330/253 |

(Continued)

*Primary Examiner* — Patricia T Nguyen
(74) *Attorney, Agent, or Firm* — IP & T Group LLP

(57) ABSTRACT

A differential amplification circuit includes a first current control unit configured to control driving current in response to a voltage level difference between first input voltage and second input voltage, a second current control unit configured to control the driving current in response to a voltage level difference between the second input voltage independent from temperature and a temperature voltage depending on the temperature, and a signal output unit configured to generate a detection signal in response to the driving current.

12 Claims, 6 Drawing Sheets

(56) References Cited

U.S. PATENT DOCUMENTS

| | | | |
|---|---|---|---|
| 2009/0237151 A1* | 9/2009 | Yoshida | G05F 3/02 327/539 |
| 2010/0026377 A1* | 2/2010 | Weder | G05F 1/561 327/538 |
| 2010/0090748 A1* | 4/2010 | Ito | G11C 16/30 327/512 |
| 2015/0022241 A1* | 1/2015 | Ariyama | G01R 33/07 327/76 |

* cited by examiner

DIFFERENTIAL AMPLIFIER

CROSS-REFERENCE TO RELATED APPLICATIONS

This application is a division of U.S. patent application Ser. No. 13/844,917 filed on Mar. 16, 2013, which claims priority of Korean Patent Application No. 10-2012-0148544, filed on Dec. 18, 2012. The disclosure of each of the foregoing application which is incorporated herein by reference in its entirety.

BACKGROUND

1. Field

Exemplary embodiments of the present invention relates to a semiconductor design technology, and more particularly, to a differential amplifier.

2. Description of the Related Art

Generally, an internal voltage generation circuit for generating internal voltage is mounted in a semiconductor device including, for example, a double data rate synchronous DRAM (DDR SDRAM) and the semiconductor device may use various voltage levels of the internal voltage generated therein to secure more efficient power consumption and a more stable circuit operation. As the internal voltage, there are an internal voltage generated by down-converting supply power voltage supplied from the outside and an internal voltage generated by pumping supply power voltage and ground power voltage. Herein, the internal voltage generated by a down converting operation may include core voltage used as a data level and precharge voltage used at the time of a precharge operation, and the internal voltage generated by a pumping operation may include pumping voltage applied to a gate of a cell transistor and substrate bias voltage applied to a substrate of the cell transistor.

An internal voltage generation circuit generally performs a comparison operation of comparing an internal voltage outputted therefrom with reference voltage to determine whether the internal voltage driving operation is performed or not. Therefore, the internal voltage generation circuit includes a component for comparing internal voltage with reference voltage and the component may be a voltage detection circuit. Herein, the voltage detection circuit is generally configured as a differential amplifier.

FIG. 1 is a block diagram for illustrating a general internal voltage generation circuit.

Referring to FIG. 1, the internal voltage generation circuit includes a voltage detection unit 110 and an internal voltage generation unit 120.

The voltage detection unit 110 detects internal voltage V_INN based on reference voltage V_REF to generate an oscillation activation signal EN_OSC corresponding to a voltage level difference between the reference voltage V_REF and the internal voltage V_INN. Herein, the reference voltage V_REF may have a constant voltage level independent from temperature, that is, a voltage level is independent from the temperature.

The internal voltage generation unit 120 generates the internal voltage V_INN in response to the oscillation activation signal EN_OSC and includes an oscillator 121 and a pump 122. Herein, the oscillator 121 generates the oscillation signal OSC in response to the oscillation activation signal EN_OSC and the pump 122 generates the internal voltage V_INN by the pumping operation in response to the oscillation signal OSC. The generated internal voltage V_INN is fed back to the voltage detection unit 110 so as to be compared with the reference voltage V_REF again.

FIG. 2 is a circuit diagram for illustrating the voltage detection unit 110 of FIG. 1.

Referring to FIG. 2, the voltage detection unit 110 includes a current driving unit 210, a signal input unit 220, a current sinking unit 230, and a signal output unit 240.

The current driving unit 210 drives an output terminal and includes first and second PMOS transistors PM1 and PM2. The signal input unit 220 receives the internal voltage V_INN and the reference voltage V_REF and includes first and second NMOS transistors NM1 and NM2. The current sinking unit 230 sinks driving current flowing through the voltage detection unit 110 in response to bias voltage V_BIA and includes a third NMOS transistor NM3. In addition, the signal output unit 240 generates the oscillation activation signal EN_OSC in response to the driving current flowing through an output terminal and includes an inverter INV.

Meanwhile, as described above, the reference voltage V_REF is a signal having a constant voltage level independent from the temperature. The voltage detection unit 110 may perform a constant comparison operation based on the reference voltage V_REF, which is independent from the temperature.

However, with the recent development of a process technology, a design-rule of a sub-micron or less is applied in designing a circuit, such that a unique characteristic of a circuit may be changed according to a change in temperature. For example, in the case of the MOS transistor, according to the change of temperature, not only the threshold voltage but the characteristics of the leakage current may be changed. Therefore, the unique characteristics of the MOS transistor included in the voltage detection unit 110 of FIG. 2 may be also changed according to the temperature to cause malfunction.

SUMMARY

An embodiment of the present invention is directed to a differential amplifier capable of performing a differential amplification operation according to temperature.

Another embodiment of the present invention is directed to an internal voltage generation circuit using a differential amplifier performing a differential amplification operation according to temperature to generate internal voltage.

In accordance with an embodiment of the present invention, a differential amplification circuit includes a first current control unit configured to control driving current in response to a voltage level difference between a first input voltage and a second input voltage, a second current control unit configured to control the driving current in response to a voltage level difference between the second input voltage independent from temperature and a temperature voltage depending on the temperature, and a signal output unit configured to generate a detection signal in response to the driving current.

In accordance with another embodiment of the present invention, an internal voltage generation circuit includes a reference voltage generation unit configured to generate first reference voltage depending on temperature and second reference voltage independent from the temperature, a voltage detection unit configured to generate an activation signal detecting an internal voltage based on the second reference voltage in response to first driving current corresponding to a voltage level difference between the internal voltage and the second reference voltage and a second driving current corresponding to a voltage level difference between the first reference voltage and the second reference voltage, and an internal voltage generation unit configured to generate the internal voltage in response to the activation signal.

In accordance with still another embodiment of the present invention, a method of operating a differential amplification circuit includes generating a first driving current in response to a reference voltage and an input voltage independent from temperature, reflecting a second driving current in addition to the first driving current by detecting a change in temperature to generate a final driving current, and generating a detection signal corresponding to a voltage level difference between the input voltage and the reference voltage in response to the final driving current.

The embodiments of the present invention may control the driving current of the differential amplification unit according to the temperature to perform the differential amplification operation. Further, the embodiments of the present invention may use the differential amplifier as a part of configuration to generate the internal voltage.

DETAILED DESCRIPTION

Hereinafter, embodiments of the present invention will be described in detail with reference to the accompanying drawings so that those skilled in the art may easily practice the present invention.

Figure 3:
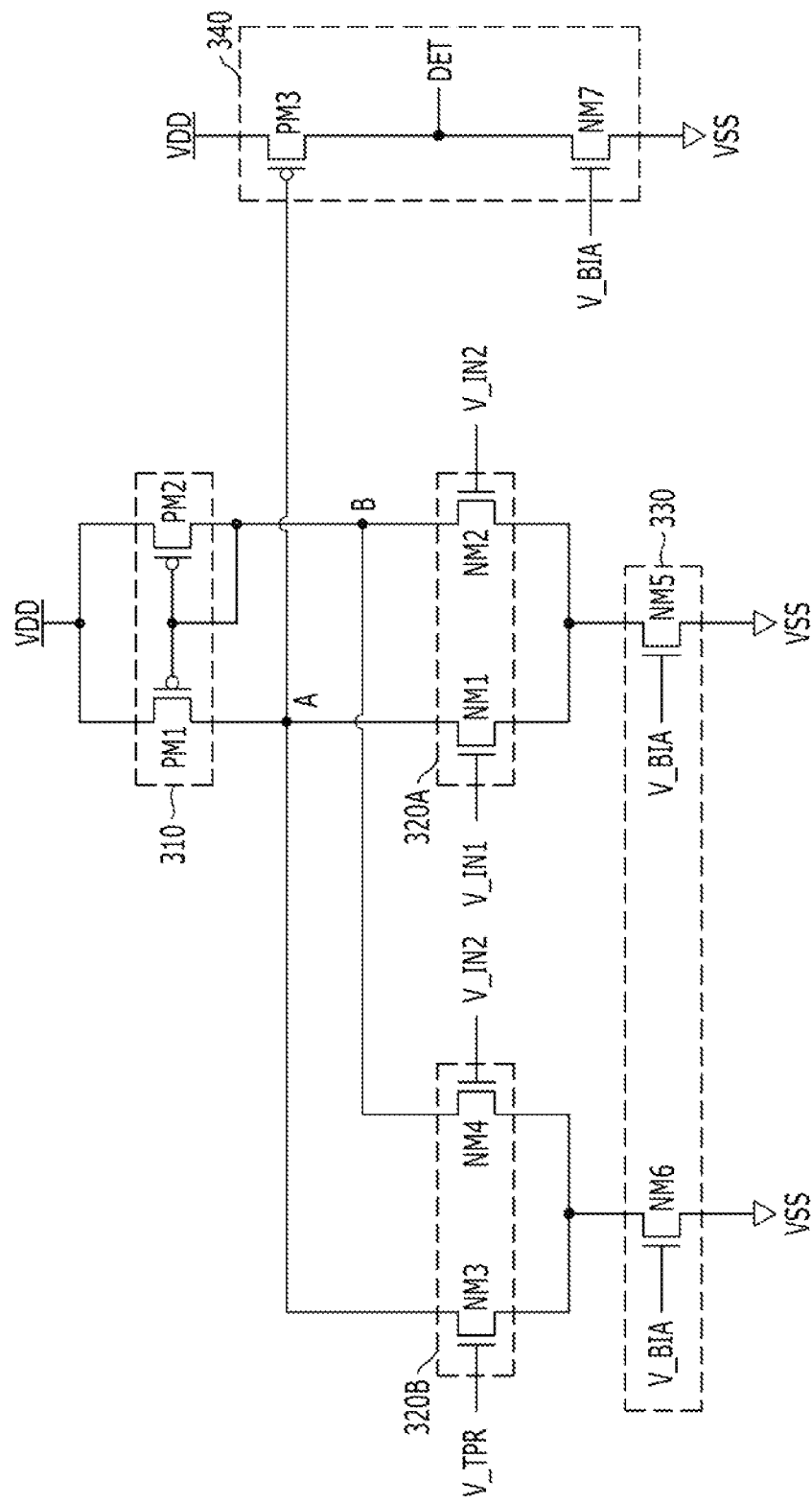
FIG. 3 is a block diagram for illustrating a differential amplification circuit in accordance with an embodiment of the present invention.

FIG. 3 is a block diagram for illustrating a differential amplification circuit in accordance with an embodiment of the present invention.

Referring to FIG. 3, a differential amplification circuit includes a current driving unit 310 first and second current driving units 320A and 320B, a current sinking unit 330, and a signal output unit 340.

The current driving unit 310 drives an output terminal with a predetermined driving current and includes first and second PMOS transistors PM1 and PM2. In this configuration, the first PMOS transistor PM1 is coupled to a first node A that is an output terminal and the second PMOS transistor PM2 is coupled to a second node B.

The first current driving unit 320A controls a driving current of the first node A and the second node B in response to a voltage level difference between a first input voltage V_IN1 and a second input voltage V_IN2 and includes a first NMOS transistor NM1 and a second NMOS transistor NM2. Herein, the second input voltage V_IN2 may be independent from the temperature. That is, the second input voltage V_IN2 has a fixed voltage level even when the temperature is changed. In this case, a differential amplification circuit in accordance with the embodiment of the present invention may detect the voltage level of the first input voltage V_IN1 based on the second input voltage V_IN2.

The second current driving unit 320B controls a driving current of the first node A and the second node B in response to a voltage level difference between the second input voltage V_IN2 and temperature voltage V_TPR and includes a third NMOS transistor NM3 and a fourth NMOS transistor and NM4. Herein, the temperature voltage V_TPR may be dependent on the temperature. That is, when the temperature is changed, the voltage level of the temperature voltage V_TPR is also changed.

The current sinking unit 330 sinks the driving current flowing through the first and second current driving units 320A and 320B and includes a fifth NMOS transistor NM5 and a sixth NMOS transistor NM6 that receive a predetermined voltage level of bias voltage V_BIA. Here, the fifth NMOS transistor NM5 is coupled to the first current driving unit 320A and the sixth NMOS transistor NM6 is coupled to the second current driving unit 320B.

The signal output unit 340 generates a detection signal DET in response to the driving current flowing through the first node A that is the output terminal and the bias voltage and includes a third PMOS transistor PM3 coupled to the first node A and a seventh NMOS transistor NM7 receiving the bias voltage V_BIA.

Hereinafter, a simple circuit operation of a differential amplification circuit will be described. For convenience of explanation, the case in which the temperature voltage V_TPR depending on the temperature has a low voltage level at low temperature and has a high voltage level at high temperature will be described by way of example. Further, the second input voltage V_IN2 keeps a constant voltage level even though the temperature is changed and it is assumed that the voltage level may be the same as the voltage level of the temperature voltage V_TPR at the high temperature. The second input voltage V_IN2 becomes the reference voltage for detecting the voltage level of the first input voltage V_IN1.

First, when the temperature is increased, the temperature voltage V_TPR is equal to the voltage level of the second input voltage V_IN2. Therefore, the second current driving unit 320B does not generate the differential current (hereinafter, referred to as 'a second differential current') corresponding to the different in the voltage level between the temperature voltage V_TPR and the second input voltage V_IN2, which means that the driving current is controlled only by the first current driving unit 320A. That is, the differential current (hereinafter, referred to as 'a first differential current') is generated in response to the voltage level difference between the first input voltage V_IN1 and the second input voltage V_IN2 input to the first current driving unit 320A and the detection signal DET has a value set according to the first differential current.

Next, when the temperature is low, the voltage level of the temperature voltage V_TPR is reduced gradually, and thus the difference in the voltage level between the temperature voltage V_TPR and the second input voltage V_IN2 is increased gradually. Therefore, the second current driving unit 320B generates the second differential current corresponding to the difference in the voltage level between the temperature voltage V_TPR and the second input voltage V_IN2, which means that the driving current is controlled only by the first current driving unit 320A and the second current driving unit 320B. That is, the first differential current is generated in response to the voltage level difference between the first input voltage V_IN1 and the second input voltage V_IN2 input to the first current driving unit 320A and the second differential current is generated in response to the voltage level difference between the temperature voltage V_TPR and the second input voltage V_IN2 input to the second current driving unit 320B and the detection signal DET has a value generated according to the first and second differential current.

Figure 4:
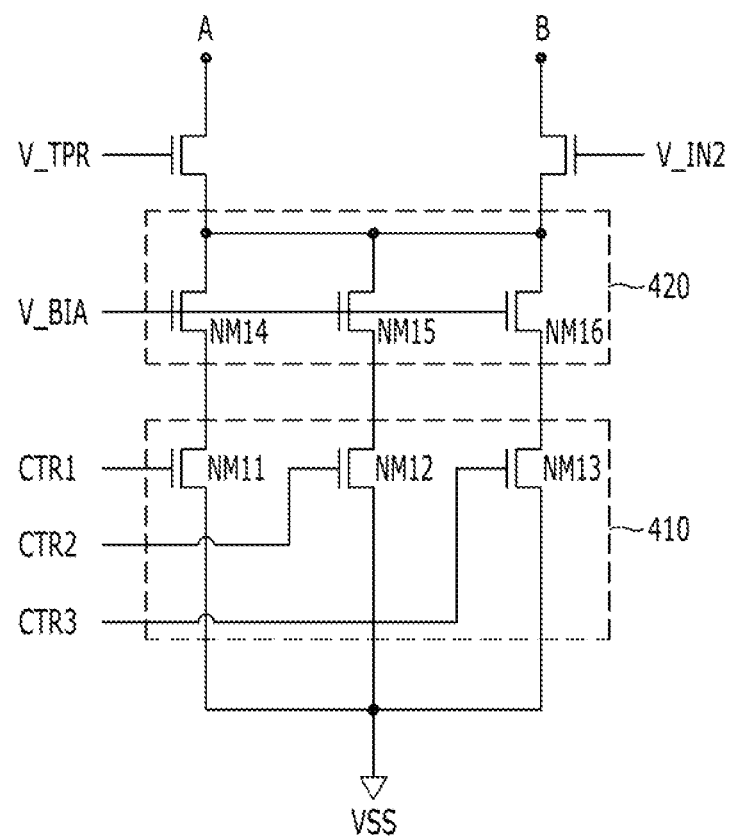
FIG. 4 is a circuit diagram for illustrating another embodiment of a second current driving unit of FIG. 3.

FIG. 4 is a circuit diagram for illustrating a second current driving unit in accordance with another embodiment of the present invention. The second current driving unit illustrated in FIG. 4 further includes a current trimming unit 410 as compared with the second current driving unit 320B in FIG. 3. The current sinking unit 420 has a structure corresponding to the current trimming unit 410.

Referring to FIG. 4, the current trimming unit 410 controls the amount of differential current sunk by the current sinking unit 420 and includes first to third NMOS transistors NM11, NM12, and NM13. Herein, each of the first to third NMOS transistors NM11, NM12, and NM13 is controlled in response to first to third control signals CTR1, CTR2, and CTR3, respectively, and the current amount sunk to the ground voltage terminal VSS is controlled in response to the first to third control signals CTR1, CTR2, and CTR3.

The current sinking unit 420 includes fourth to sixth NMOS transistors NM14, NM15, and NM16, which are corresponding to each of the first to third NMOS transistors NM11, NM12, and NM13 of the current trimming unit 410.

Figure 1:
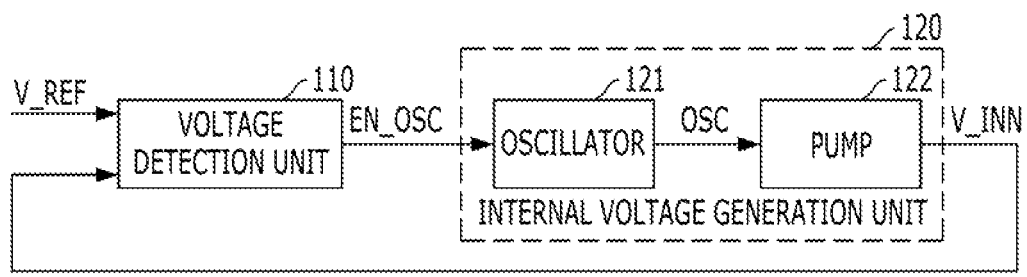
FIG. 1 is a block diagram for illustrating a general internal voltage generation circuit.
Figure 2:
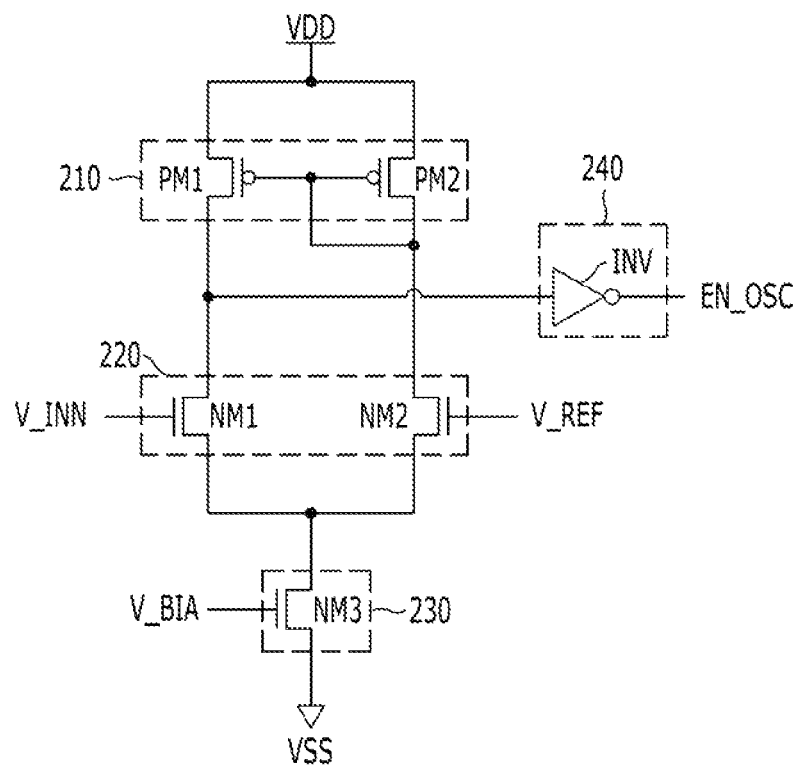
FIG. 2 is a circuit diagram for illustrating the voltage detection unit.

The differential amplification circuit to the embodiment of the present invention controls the driving current according to the voltage level difference between the second input voltage V_IN2 independent from the temperature and the temperature voltage V_TPR depending on the temperature to compensate for all the range of circuit characteristics varying according to the temperature. For reference, when the voltage level of the reference voltage V_REF varies according to temperature in the existing configuration as illustrated in FIG. 2, it is very difficult to compensate the range of circuit characteristics varying according to temperature.

Figure 5:
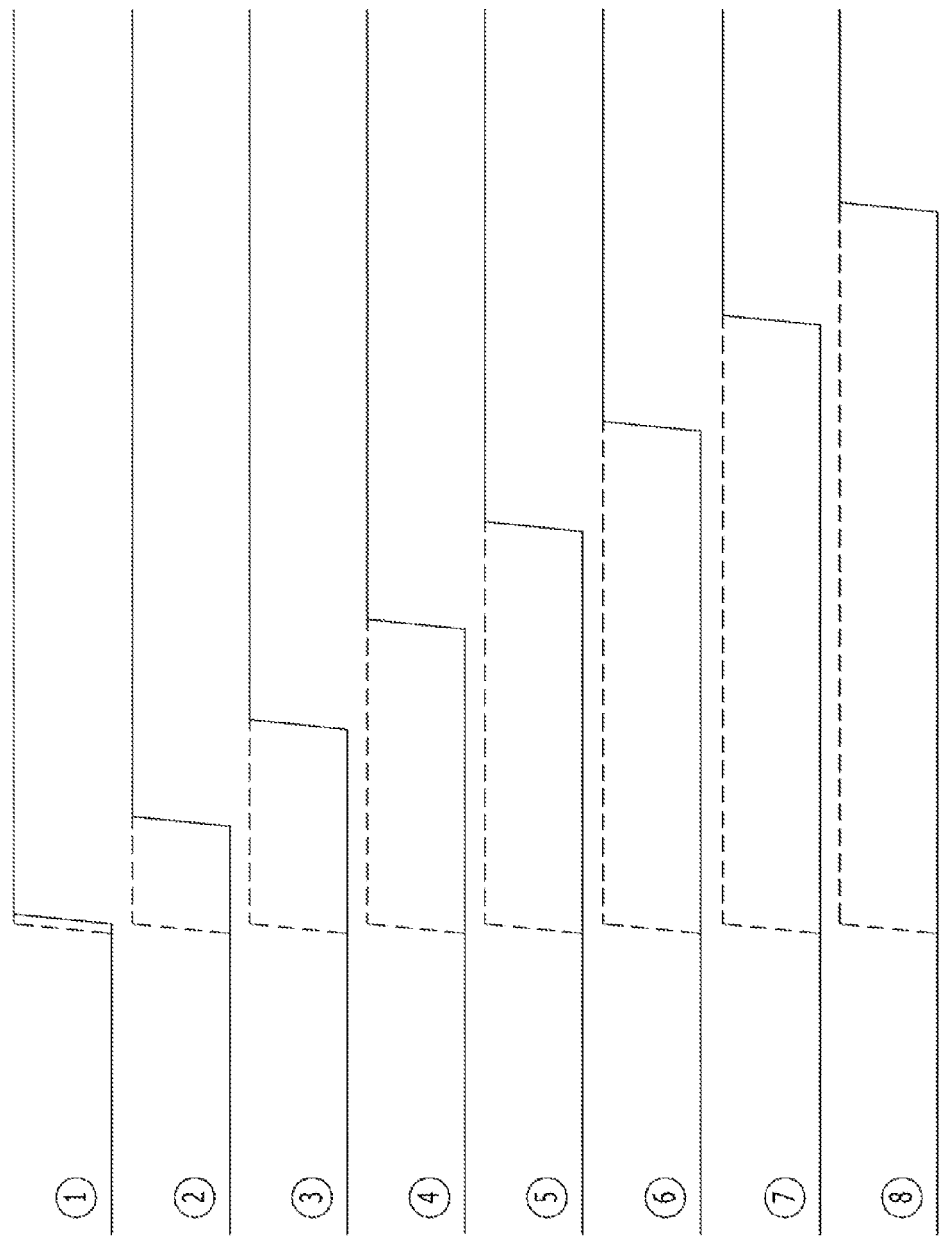
FIG. 5 is an operation waveform diagram for illustrating a circuit operation of FIG. 4.

FIG. 5 is an operation waveform diagram for illustrating operation of the second current driving unit illustrated in FIG. 4 and illustrates a trimming operation of the second driving current driving unit according to the first to third control signals CTR1, CTR2, and CTR3 of FIG. 4.

For convenience of explanation, in FIG. 5, the operation waveform of relatively high temperature of 95° C. is indicated by a dotted line and the operation waveform of the relatively low temperature of −10° C. is indicated by a solid line. Further, it is assumed that the loading values of the first to third NMOS transistors NM11, NM12, and NM13 corresponding to the first to third control signals CTR1, CTR2, and CTR3 have different weight values. That is, when the loading value of the first NMOS transistor NM11 is set to be 1, the loading value of the second NMOS transistor NM12 may be set to be 2 and the loading value of the third NMOS transistor NM13 may be set to be 4.

Referring to FIG. 5, in the case of ①  all the first to third control signals CTR1, CTR2, and CTR3 are in the inactive state, in the case of ② only the first control signal CTR1 is in the active state, in the case of ③ only the second control signal CTR2 is in the active state, and in the case of ④ the first and second control signals CTR1 and CTR2 are in the active state. Further, in the case of ⑧, all the first to third control signals CTR1, CTR2, and CTR3 are in the active state.

The differential amplification circuit to the embodiment of the present invention controls the driving current according to the voltage level difference between the second input voltage V_IN2 independent from the temperature and the temperature voltage V_TPR depending on the temperature to compensate for the range of circuit characteristics varying according to temperature and can more widen the range of circuit characteristics varying according to temperature by the trimming control unit 410.

Figure 6:
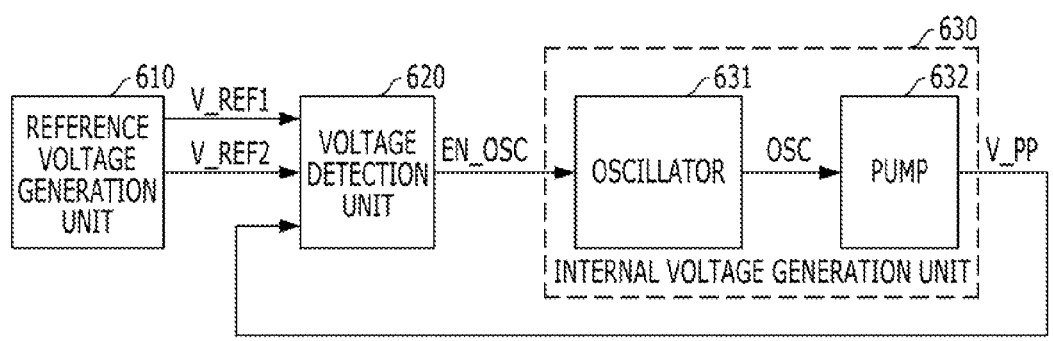
FIG. 6 is a block diagram for illustrating an internal voltage generation circuit using a differential amplification circuit of FIG. 3.

FIG. 6 is a block diagram for illustrating an internal voltage generation circuit using a differential amplification circuit of FIG. 3.

Referring to FIG. 6, the internal voltage generation circuit includes a reference voltage generation unit 610, a voltage detection unit 620, and an internal voltage generation unit 630.

The reference voltage generation unit 610 generates a first reference voltage V_REF1 depending on the temperature and a second reference voltage V_REF2 independent from the temperature.

The voltage detection unit 620 generates the oscillation activation signal EN_OSC in response to the first driving current corresponding to the voltage level difference between the pumping voltage V_PP that is the internal voltage and the second reference voltage V_REF2, and the second driving current corresponding to the voltage level difference between the first reference voltage V_REF1 and the second reference voltage V_REF2. Here, the first reference voltage V_REF1 corresponds to the temperature voltage V_TPR of FIG. 3 and the second reference voltage V_REF2 corresponds to the second input voltage V_IN2 of FIG. 3. Further, the oscillation activation signal EN_OSC corresponds to the detection signal DET of FIG. 3.

The oscillation activation signal EN_OSC generated in the embodiment of the present invention is a signal detecting the pumping voltage V_PP based on the second reference voltage V_REF2 and is a signal additionally reflecting the circuit characteristics varying according to the temperature.

The internal voltage generation unit 630 generates the pumping voltage V_PP in response to the oscillation activation signal EN_OSC. The internal voltage generation unit 630 includes an oscillator 631 generating the oscillation signal OSC in response to the oscillation activation signal EN_OSC, and a pump 632 generating the pumping voltage V_PP by the pumping operation responding to the oscillation signal OSC. Next, the generated pumping voltage V_PP is fed back to the voltage detection unit 620 and is compared with the second reference voltage V_RFE2. During the comparison process, the circuit characteristics varying according to temperature as described above are reflected.

Consequently, the internal voltage generation circuit in accordance with the embodiment of the present invention performs the differential amplification operation reflecting the circuit characteristics varying according to the temperature, thereby stably generating the internal voltage.

Figure 7:
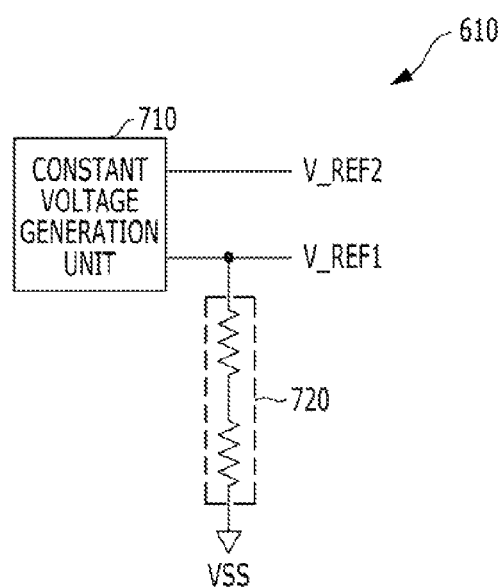
FIG. 7 is a circuit diagram for illustrating a reference voltage generation unit.

FIG. 7 is a circuit diagram for illustrating a reference voltage generation unit of FIG. 6.

Referring to FIG. 7, the reference voltage generation unit 610 includes a constant voltage generator 710 and a temperature compensator 720.

The constant voltage generator 710 generates the second reference voltage V_REF2 and may include a Widlar circuit. The temperature compensator 720 generates a loading value corresponding to temperature and may be configured of a resistor circuit. Here, the resistor circuit has a large resistance value when the temperature is increased and has a small resistance value when the temperature is reduced. Therefore, the temperature compensator 720 can generate the first reference voltage V_REF1 having characteristics corresponding to the resistance circuit.

As set forth above, the differential amplification circuit in accordance with the embodiment of the present invention compensates for the change in the circuit characteristics according to the change in temperature to perform the differential amplification operation and the internal voltage generation circuit using the same can generate the stable internal voltage even though the circuit characteristics are changed according to the temperature.

In accordance with the embodiments of the present invention, it is possible to secure the stable differential amplification operation by controlling the driving current, even though the circuit characteristics are changed according to the temperature.

Further, it is possible to generate the stable internal voltage by controlling the differential amplification operation used to generate the internal voltage according to temperature even though the circuit characteristics are changed.

Although the spirit of the present invention was described in detail with reference to the preferred embodiments, it should be understood that the preferred embodiments are provided to explain, but do not limit the spirit of the present invention. Also, it is to be understood that various changes and modifications within the technical scope of the present invention are made by a person having ordinary skill in the art to which this invention pertains.

Further, the logic gate and the transistor described in the foregoing embodiments may be implemented to have different positions and kinds according to polarity of an input signal.

What is claimed is:

1. An internal voltage generation circuit, comprising:
   a reference voltage generation unit configured to generate a first reference voltage depending on temperature and a second reference voltage independent from the temperature;
   a voltage detection unit configured to generate an activation signal detecting an internal voltage based on the second reference voltage in response to a first driving current corresponding to a voltage level difference between the internal voltage and the second reference voltage and a second driving current corresponding to a voltage level difference between the first reference voltage and the second reference voltage; and
   an internal voltage generation unit configured to generate the internal voltage in response to the activation signal.

2. The internal voltage generation circuit of claim 1, wherein the reference voltage generation unit includes:
   a constant voltage generator configured to generate the second input voltage; and
   a temperature compensator configured to have a loading value corresponding to the temperature and generate the first reference voltage.

3. The internal voltage generation circuit of claim 1, wherein the voltage detection unit includes:
   a first current control unit configured to control the first driving current in response to the voltage level difference between the internal voltage and the second reference voltage;
   a second current control unit configured to control the second driving current in response to the voltage level difference between the first reference voltage and the second reference voltage; and
   a signal output unit configured to generate the activation signal corresponding to the first and second driving current.

4. The internal voltage generation circuit of claim 3, further comprising:
   a current sinking unit configured to sink the second driving current in response to a bias voltage.

5. The internal voltage generation circuit of claim 4, further comprising:
   a current driving unit configured to drive an output terminal coupled to the first current control unit and the second current control unit.

6. The internal voltage generation circuit of claim 4, wherein the signal output unit generates the activation signal in response to the driving current and the bias voltage.

7. The internal voltage generation circuit of claim 4, further comprising:
   a current trimming unit configured to control an amount of the second driving current sunk through the current sinking unit.

8. The internal voltage generation circuit of claim 7, wherein the number of the current sinking units is the same as the number of current trimming units.

9. The internal voltage generation circuit of claim 1, wherein the internal voltage generation unit includes:
   an oscillator configured to generate an oscillation signal in response to the activation signal; and
   a pump configured to generate the internal voltage by a pumping operation in response to the oscillation signal.

10. A method of operating a differential amplification circuit, comprising:
    generating a first driving current in response to a reference voltage and an input voltage independent from temperature;
    reflecting a second driving current in addition to the first driving current by detecting a change in temperature to generate a final driving current; and
    generating a detection signal corresponding to a voltage level difference between the input voltage and the reference voltage in response to the final driving current.

11. The method of claim 10, wherein the second driving current is generated in response to temperature voltage depending on temperature and the reference voltage.

12. The method of claim 11, wherein the first driving current is differential current corresponding to a voltage level difference between the input voltage and the reference voltage, and the second driving current is differential current corresponding to a voltage level difference between the temperature voltage and the reference voltage.

* * * * *